United States Patent
Cuddy

(10) Patent No.: US 6,570,458 B2
(45) Date of Patent: May 27, 2003

(54) LOW NOISE MICROWAVE SYNTHESIZER EMPLOYING HIGH FREQUENCY COMBS FOR TUNING DRIFT CANCEL LOOP

(75) Inventor: Bernard M. Cuddy, Cambridge, MA (US)

(73) Assignee: Teradyne, Inc., Boston, MA (US)

( * ) Notice: Subject to any disclaimer, the term of this patent is extended or adjusted under 35 U.S.C. 154(b) by 0 days.

(21) Appl. No.: 09/879,421

(22) Filed: Jun. 12, 2001

(65) Prior Publication Data

US 2002/0196088 A1 Dec. 26, 2002

(51) Int. Cl.[7] .............................................. H03B 21/00
(52) U.S. Cl. .............................. 331/37; 331/2; 331/42; 331/43
(58) Field of Search ........................... 331/37, 40, 43, 331/44, 2, 50, 42; 327/105; 455/209; 324/612, 613, 622, 623, 620, 621

(56) References Cited

U.S. PATENT DOCUMENTS

| | | | |
|---|---|---|---|
| 3,895,311 A | 7/1975 | Basse et al. | 331/1 A |
| 4,042,891 A | 8/1977 | Levine | 331/1 R |
| 4,156,205 A | 5/1979 | Kadin et al. | 331/25 |
| 4,290,028 A | 9/1981 | LeGrand | 331/1 A |
| 4,725,786 A | 2/1988 | Papaieck | 328/14 |
| 5,303,412 A | 4/1994 | Kushner | 455/260 |
| 5,394,117 A | 2/1995 | Cohen | 331/47 |
| 5,412,352 A | 5/1995 | Graham | 332/103 |
| 5,508,661 A | 4/1996 | Keane et al. | 331/37 |
| 5,706,310 A * | 1/1998 | Wang et al. | 375/296 |
| 5,878,335 A | 3/1999 | Kushner | 455/260 |

OTHER PUBLICATIONS

"Frequency Synthesis, Techniques and Applications", Chapter 6, G.H. Lohrer, IEEE Press, ISBN 0–87942–039–1, 1975.

* cited by examiner

*Primary Examiner*—Robert Pascal
*Assistant Examiner*—Kimberly E Glenn
(74) *Attorney, Agent, or Firm*—Bruce D. Rubenstein

(57) ABSTRACT

A microwave synthesizer includes a drift-cancel loop having a narrow-band input, a low-frequency comb input, a wide-band input, and an output for providing an adjustable-frequency output signal. A narrow-band synthesizer is coupled to the narrow-band input, and a comb generator is coupled to the low-frequency comb input. Instead of using a wide-band synthesizer to drive the wide-band input, as conventional topologies have done, the instant invention employs a highly stable, low noise high frequency oscillator. The output of the oscillator is mixed with the output of the comb generator to produce low-noise, high frequency combs. The low-noise, high frequency combs are then used to drive the wide-band input of the drift-cancel loop. Significant reductions in phase noise can be achieved as compared with conventional designs.

20 Claims, 5 Drawing Sheets

LOW NOISE MICROWAVE SYNTHESIZER EMPLOYING HIGH FREQUENCY COMBS FOR TUNING DRIFT CANCEL LOOP

FIELD OF THE INVENTION

This invention relates generally to automatic test equipment for electronics (ATE) and, more particularly, to the synthesis of low-noise, high frequency waveforms for testing microwave and RF circuitry.

BACKGROUND OF THE INVENTION

Significant improvements in the accuracy of high-frequency devices used in consumer products such as cellular telephones, pagers, and wireless personal data assistants (PDAs) have created a need for more accurate testing of these devices. ATE systems generally include one or more microwave synthesizer for testing microwave devices. In one typical testing scenario, a microwave synthesizer within the tester supplies a signal directly to the DUT. The DUT provides a response, which the tester measures and tests. In another testing scenario, a tester receives a microwave signal (e.g., 900 MHz) from a device under test (DUT). The tester mixes this signal with the output of one of its microwave synthesizers to generate an intermediate frequency signal (e.g., 10 MHz). The tester then samples the intermediate frequency signal to ascertain its characteristics. If the characteristics are within predetermined limits, the test passes. Otherwise, the test fails.

One common testing technique is to compute a power spectrum of the intermediate frequency signal derived from the device under test. A power spectrum reveals meaningful information about the DUT as well as phase noise. To accurately test the phase noise of the device under test, it is essential that the synthesizer's phase noise be small compared with that of the DUT. If the synthesizer's phase noise is large compared with that of the DUT, the DUT's phase noise becomes lost in the synthesizer's phase noise, and it becomes impossible to tell whether the DUT meets its phase noise specification. As devices are continually improved to deliver lower and lower phase noise, microwave synthesizers must correspondingly be improved if testing is to remain accurate.

FIG. 1 illustrates a conventional microwave synthesizer 100, which operates as follows. A narrow-band synthesizer 112 generates an output signal that can be varied over a relatively narrow range, e.g., a 200 MHz range between 800 MHz and 1 GHz. Simultaneously, a wide-band synthesizer 122 generates an output signal that can be varied over a relatively wide frequency range, e.g., a 2 GHz range between 4.4 GHz and 6.2 GHz. Simultaneously, a comb generator 116 produces a series of harmonically spaced tones, or "combs," e.g., at 200 MHz tone spacing. The output of the narrow-band synthesizer 112, the wide-band synthesizer 114, and the comb generator 116 are respectively fed to a narrow-band input 152, a wide-band input 154, and a comb input 156 of a drift-cancel loop 150.

Within the drift-cancel loop 150, a power splitter 130 divides the output of the wide-band synthesizer 122 into first and second circuit paths. Amplifiers 132 and 134 boost the levels of signals along the respective paths. A first mixer 138 combines the output of the amplifier 132 with the output of the comb generator 116, to produce a different pair of sum and difference tones for each tone produced by the comb generator 116. By appropriately tuning the frequency of the wide-band synthesizer 122, one of the sum or difference tones from the mixer 138 can be made to equal a target frequency, $F_K$. For normal operation, the inputs to the drift-cancel loop 150 are always adjusted to produce a tone at the output of the mixer 138 that equals $F_K$.

A first band-pass filter 142 filters the output of the mixer 138. The first band-pass filter 142 has a center frequency at $F_K$, and has a narrow bandwidth for passing only the mixing product at $F_K$ and substantially rejecting all other frequency components. The output of the first band-pass filter 142 is passed to a second mixer 146, which combines the output of the first band-pass filter 142 with the output of the narrow-band synthesizer 112, thus producing another pair of sum and difference tones. These sum and difference tones are passed to a second band-pass filter 144, which generally rejects the sum tone and transmits the difference tone to its output.

The transmitted tone is passed to a third mixer 140. The third mixer 140 combines the transmitted tone with the output of the amplifier 134 to produce yet another pair of sum and difference tones. A low-pass filter 148 blocks the sum tone and transmits the difference tone to the output of the synthesizer 100. The output may be coupled to additional stages (not shown), for selectively multiplying the frequency and adjusting the amplitude of the output signal.

The output frequency of the synthesizer 100 is adjustable in two ways. First, the wide-band synthesizer 122 can be adjusted to vary the overall output frequency in large increments. Second, the narrow-band synthesizer 112 can be adjusted to vary the overall output frequency in small increments. The narrow band synthesizer 122 generally operates via direct digital synthesis (DDS) to produce a nearly continuous range of output frequencies. The frequency range of the narrow-band synthesizer 112 preferably equals or exceeds the spacing of consecutive combs produced by the comb generator 116, to allow the narrow-band synthesizer to fully tune between adjacent combs. With this arrangement, the wide-band synthesizer 122 effects gross frequency changes, whereas the narrow-band synthesizer 122 effects fine frequency changes. The combination allows the frequency of the synthesizer 100 to be adjusted over a wide range with high precision.

As is known, the wide-band synthesizer 122 tends to produce significant amounts of phase noise. This phase noise is greatly reduced, however, by the action of the drift-cancel loop 150. Owing to the summing and differencing actions of the mixers 138, 140, and 146, the frequency of the wide-band synthesizer 122 is made to cancel from the output of the synthesizer 100. Along with the frequency of the wide-band synthesizer 122, much of its phase noise is made to cancel as well.

In more elaborate implementations, a delay circuit 136 is placed between the second amplifier 134 and the third mixer 140. The delay circuit 136 causes the inputs of the third mixer 140 to convey signals that represent the output of the wide-band synthesizer 122 at corresponding instants of time. By delaying the signal conveyed along the second circuit path to match the delay incurred by the signal along the first circuit path, a great deal of phase noise is canceled by making corresponding phase perturbations common to both inputs of the mixer 140. Because the low-pass filter 148 passes only the difference of input frequencies produced by the mixer 140, noise that is common to both inputs of the mixer 140 is cancelled out.

Even with the addition of the delay circuit 136, the synthesizer 100 still fails to reject some of the phase noise of the wide-band synthesizer 122. Low frequency, or "closein," phase noise (less than 1 MHz offset) of the wide-band synthesizer largely cancels out, whereas high frequency, "far-out," phase noise (above 1 MHz offset) generally does not. In implementations that tightly control the phase noise of the narrow-band synthesizer 112 and the comb generator 116, the overall far-out phase noise of the microwave synthesizer 100 tends to be dominated by the unreduced, far-out phase noise of the wide-band synthesizer 122.

SUMMARY OF THE INVENTION

With the foregoing background in mind, it is an object of the invention to reduce the far-out phase noise of signals produced by microwave synthesizers in automatic test equipment.

To achieve the foregoing object, as well as other objectives and advantages, a microwave synthesizer according to the invention includes a drift-cancel loop having a narrow-band input, a low-frequency comb input, a wide-band input, and an output for providing an adjustable-frequency output signal. A narrow-band synthesizer is coupled to the narrow-band input, and a comb generator is coupled to the low-frequency comb input. Instead of using a wide-band synthesizer to drive the wide-band input, as conventional topologies have done, the instant invention employs a low noise, high frequency oscillator. The output of the oscillator is mixed with the output of the comb generator to produce low-noise, high frequency combs. The low-noise, high frequency combs are then used to drive the wide-band input of the drift-cancel loop. Replacing the wide-band synthesizer with high frequency combs can significantly reduce the far-out phase noise of the synthesizer as compared with conventional designs.

BRIEF DESCRIPTION OF THE DRAWINGS

Additional objects, advantages, and novel features of the invention will become apparent from a consideration of the ensuing description and drawings, in which—

DETAILED DESCRIPTION OF THE PREFERRED EMBODIMENT

Topology and Operation

Figure 1:
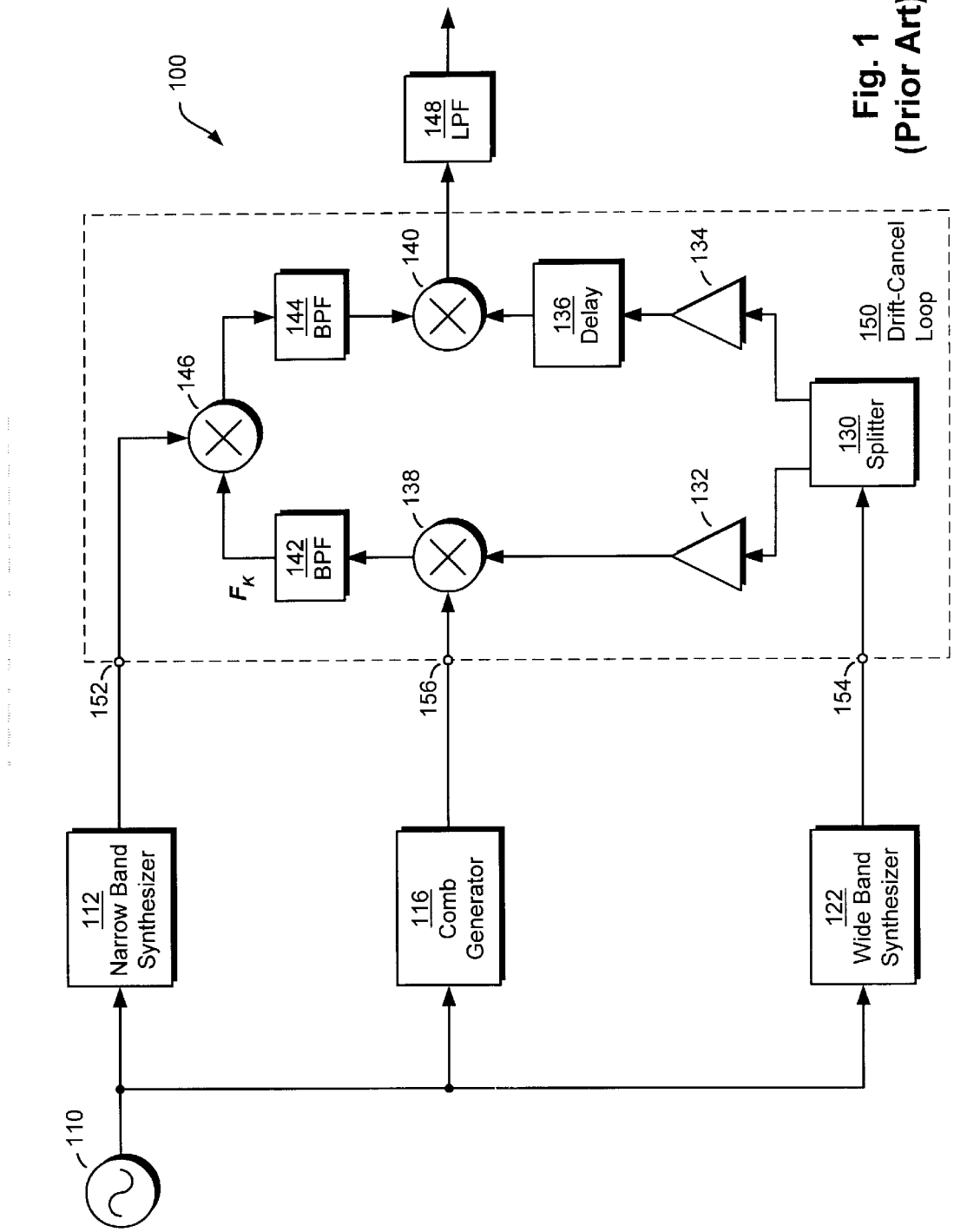
FIG. 1 is a simplified block diagram of a conventional microwave synthesizer employing a drift-cancel loop.
Figure 2:
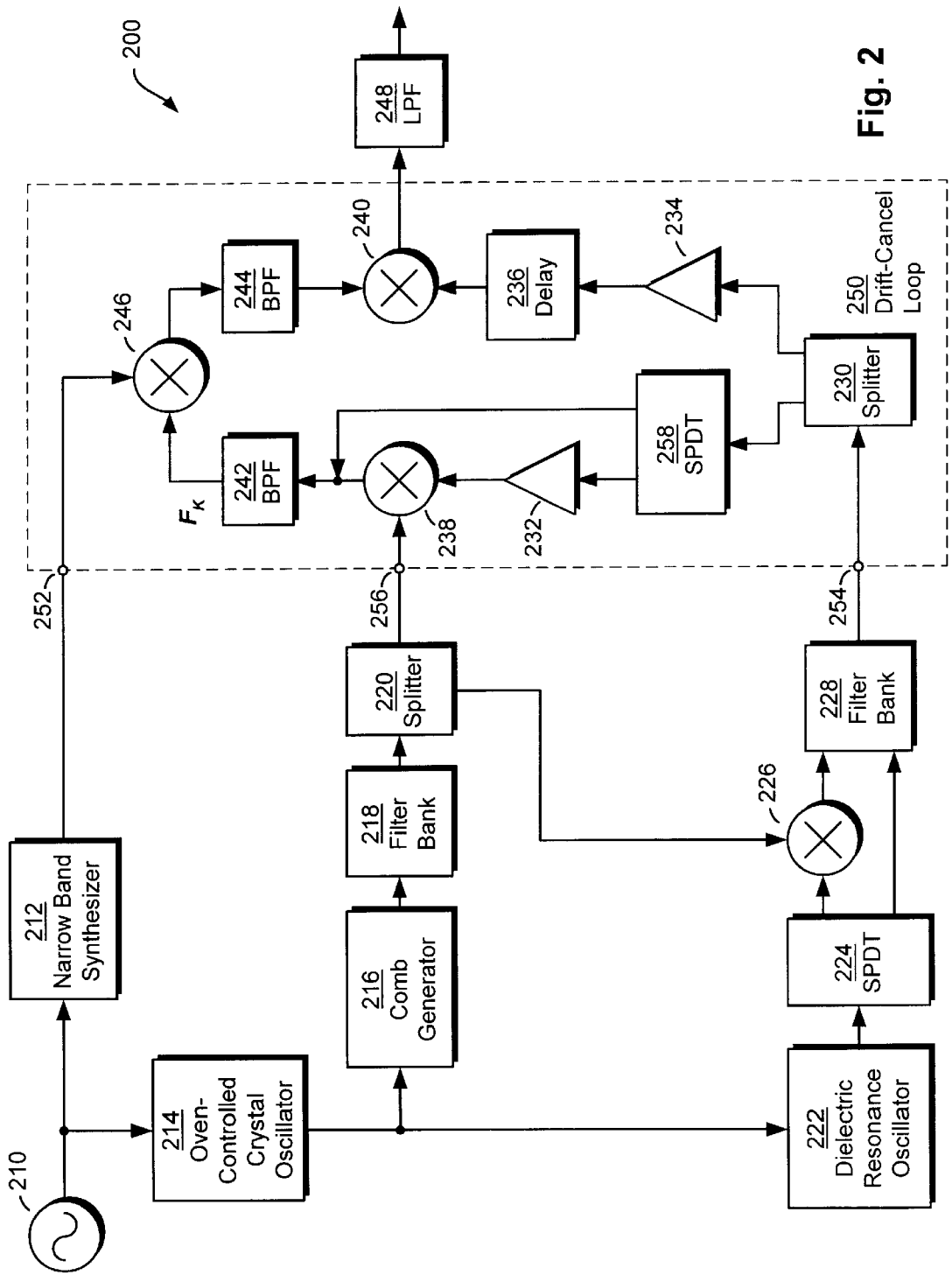
FIG. 2 is a simplified block diagram of a microwave synthesizer according to the invention.

FIG. 2 illustrates an embodiment of a microwave synthesizer 200 according to the invention. The microwave synthesizer 200 resembles the microwave synthesizer 100 of FIG. 1 in many respects. For example, the microwave synthesizer 200 includes a drift-cancel loop 250, a narrow-band synthesizer 212, a comb generator 216, and a low-pass filter 248, which are respectively analogous to structures 150, 112, 116, and 148 of FIG. 1. In addition, the drift-cancel loop 250 has a narrow-band input 252, a wide-band input 254, and a comb input 256, which respectively correspond to inputs 152, 154, and 156 of the drift-cancel loop 150 of FIG. 1.

Despite these similarities, the microwave synthesizer 200 differs from the synthesizer 100 in significant respects. This is particularly apparent with respect to the circuitry for driving the wide-band input 254. As described above, conventional drift-cancel loops employ a wide-band synthesizer consisting of a phase-locked loop to drive the wide-band input of the drift-cancel loop. The phase-locked loop generally includes a VCO or YIG (Yttrium-Iron-Garnet) oscillator. In the embodiment of FIG. 2, however, the wide-band input 254 of the drift-cancel loop is driven by a mixing product of the comb generator 216 and an oscillator 222.

The oscillator 222 generates a low-noise, high-frequency tone at $F_O$. A mixer 226 combines this low-noise tone with one of the combs $F_{SC}$ from the comb generator 216 (via a first filter bank 218 and power splitter 220), to generate a pair of sum and difference tones at $F_O \pm F_{SC}$.

A second filter bank 228 selects one of these tones, i.e., $(F_O+F_{SC})$ or $(F_O-F_{SC})$, for passage to the wide-band input 254 of the drift-cancel loop 250. Unlike the conventional design of FIG. 1, the synthesizer 200 preferably includes a first filter bank 218 for selecting a desired comb from the comb generator 216 and for blocking all other combs. The first filter bank 218 helps to prevent unwanted spurious signals from feeding into the drift-cancel loop 250, and thus reduces overall noise.

Whenever the first filter bank 218 selects a different low-frequency comb, a different sum and difference pair of frequencies is provided to the second filter bank 228. In the preferred embodiment, the low-noise oscillator 222 produces a single tone $F_O$ at 5.2 GHz and the comb generator 216 produces combs at 200 MHz, 400 MHz, 600 MHz, 800 MHz, and 1 GHz. Given these inputs, any of the following frequencies can be provided to the wide-band input 254 of the drift-cancel loop 250:

4.2 GHz, 4.4 GHz, 4.6 GHz, 4.8 GHz, and 5.0 GHz (via frequency subtraction);

5.2 GHz (via direct connection that avoids the mixer 226); and 5.4 GHz, 5.6 GHz, 5.8 GHz, 6.0 GHz, and 6.2 GHz (via frequency addition).

By appropriately selecting low frequency combs (LFCs) and high frequency combs (HFCs), the microwave synthesizer 200 can assume a variety of different frequency ranges. By adjusting the frequency of the narrow-band synthesizer 212, these different ranges can be made to continuously blend together.

If the narrow-band synthesizer 212 produces output frequencies ranging from 800 MHz to 1 GHz, the microwave synthesizer 200 can produce frequencies continuously ranging from DC to 2 GHz. For practical purposes a lower frequency limit is established at 10 MHz. Table 1, below, summarizes the manner in which the microwave synthesizer 200 selects low and high frequency combs for establishing different frequency ranges:

TABLE 1

| Selected LFC | Selected HFC | Output Frequency Range |
| --- | --- | --- |
| 800 MHz | 4.4 GHz | 10 MHz–200 MHz |
| 600 MHz | 4.6 GHz | 200 MHz–400 MHz |
| 400 MHz | 4.8 GHz | 400 MHz–600 MHz |
| 200 MHz | 5.0 GHz | 600 MHz–800 MHz |
| None (Bypass) | 5.2 GHz (Directly) | 800 MHz–1 GHz |
| 200 MHz | 5.4 GHz | 1 GHz–1.2 GHz |
| 400 MHz | 5.6 GHz | 1.2 GHz–1.4 GHz |

TABLE 1-continued

| Selected LFC | Selected HFC | Output Frequency Range |
| --- | --- | --- |
| 600 MHz | 5.8 GHz | 1.4 GHz–1.6 GHz |
| 800 MHz | 6.0 GHz | 1.6 GHz–1.8 GHz |
| 1 GHz | 6.2 GHz | 1.8 GHz–2 GHz |

To understand how these ranges are provided, one should note that the output frequency of the synthesizer 200 satisfies the equation—

$$F_{OUT} = HFC - 5.2\,GHz - NBS,$$

where HFC is the frequency of the selected high-frequency comb and NBS is the frequency of the narrow-band synthesizer 212.

To provide a 5.2 GHz tone at the wide-band input 254, a switch 224 is activated to bypass the mixer 226 and transmit the 5.2 GHz output of the oscillator 222 directly to the second filter bank 228. The filter bank 228 passes this output directly to the wide-band input 254 (see FIG. 5). When the second filter bank 228 selects the 5.2 GHz tone for passage to the wide-band input 254, the drift-cancel loop 250 activates another switch 258 to bypass the first mixer 238 and send the 5.2 GHz signal directly to the first band-pass filter 242. Under these circumstances, no mixing is required to generate $F_K$, because the signal at the wide-band input 254 already equals $F_K$.

In the preferred embodiment, the oscillator 222 is a dielectric resonance oscillator (DRO), such as the model P2579 from General Microwave Corporation of Farmingdale, N.Y. It produces a fixed frequency of 5.2 GHz and is tunable over a narrow range to allow it to be synchronized with other system components. In the preferred embodiment, the DRO 222 is synchronized with a 100 MHz oven-controlled crystal oscillator (OCXO) 214, such as the PTI X05051-001 from Piezo Technology, Inc., of Orlando, Fla. The OCXO 214 in turn is synchronized with the system reference 210. Synchronization is preferably accomplished using extremely narrow-band phase-locked loops with frequency dividers in their feedback to provide closed-loop frequency multiplication.

By replacing the wide-band synthesizer 122 with low-noise, high frequency combs, far-out phase noise of microwave synthesizer 200 is significantly reduced. Care should be taken, however, to maintain low noise throughout the synthesizer 200, and thus to obtain the full benefits of this low-noise design.

Figure 3:
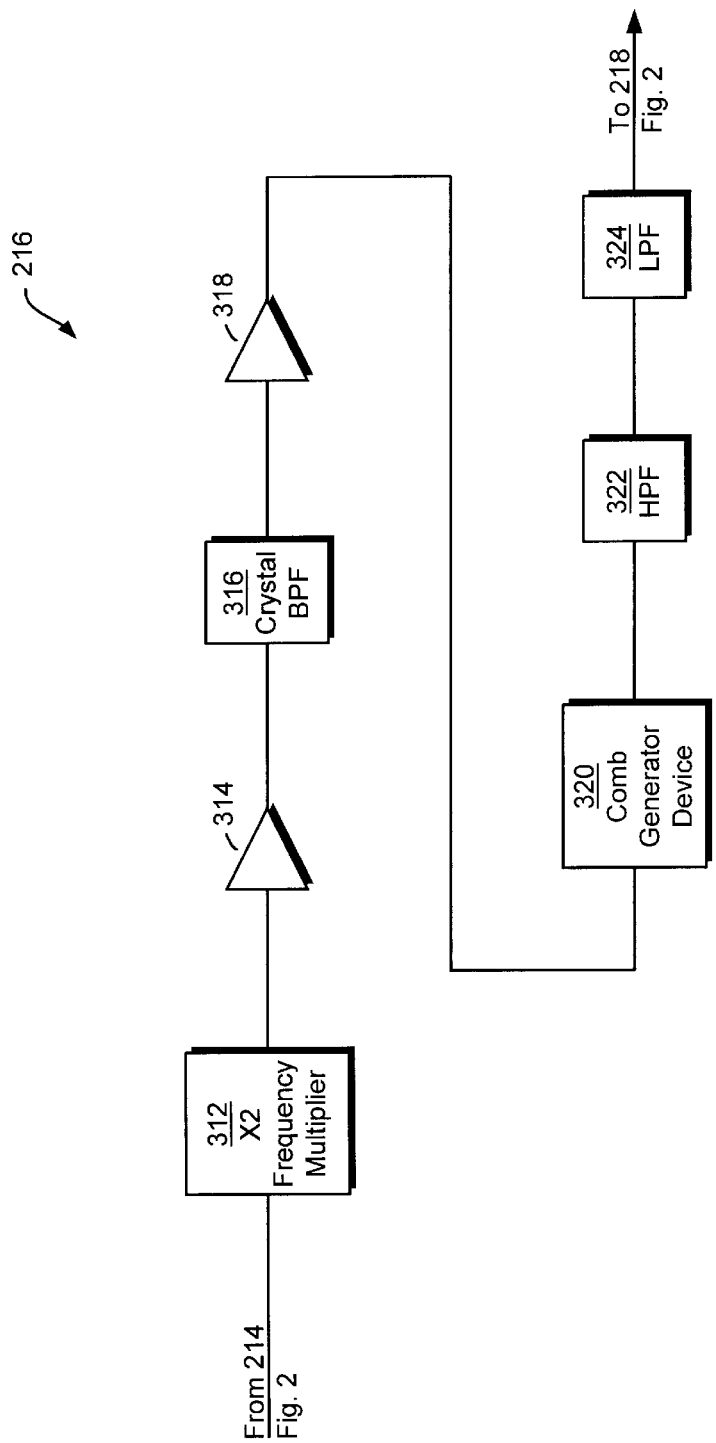
FIG. 3 is a simplified block diagram of a comb generator used in connection with the synthesizer of FIG. 2.

FIG. 3 shows a detailed block diagram of the comb generator 216 of FIG. 2. The comb generator 216 receives the ultra-low noise output of the OCXO 214. A frequency multiplier 312 multiplies the 100 MHz signal from the OCXO to produce a 200 MHz reference. An amplifier 314 boosts the 200 MHz reference, and a band-pass filter 316 filters the boosted signal. Another amplifier 318 boosts the output of the band-pass filter 316. The band-pass filter 316 is preferably a narrow-band crystal filter, for eliminating noise beyond 10 KHz offset. A suitable narrow-band crystal filter is available from Piezo Technology, Inc. A comb generator device 320 is coupled to the output of the band-pass filter 316, and generates combs at 200 MHz intervals. A suitable comb generator 320 is the GG 7014039, from Microsemi Corporation of Irvine, Calif. A high-pass filter 322 is applied to the output of the comb generator 320 to help equalize the amplitudes of the different combs, and a low-pass filter 324 is applied to the output of the comb generator 320 to filter combs above 1 GHz.

Figure 4:
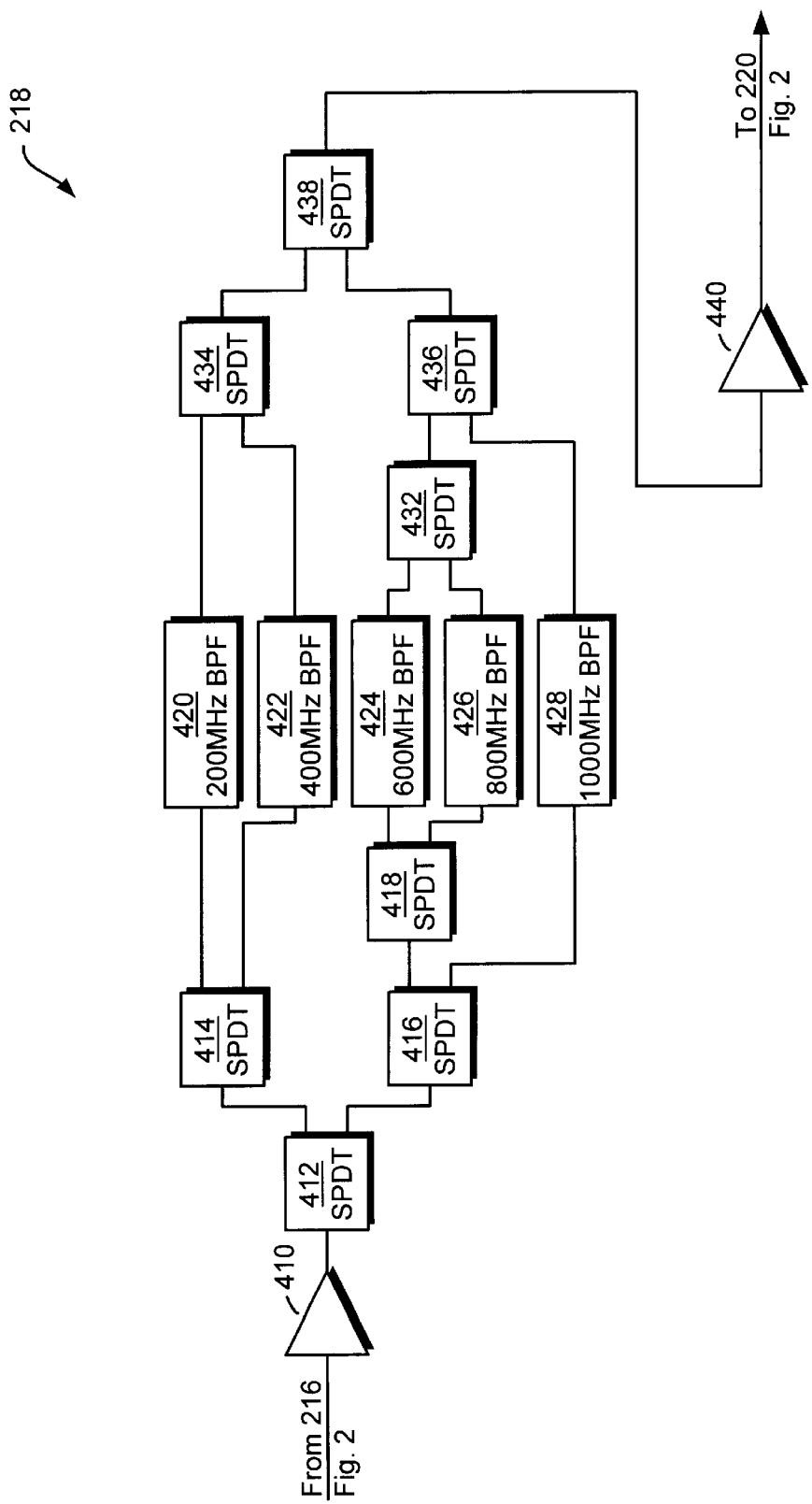
FIG. 4 is a simplified block diagram of a filter bank for selecting among the low-frequency combs in the synthesizer of FIG. 2.

FIG. 4 shows a detailed block diagram of the filter bank 218 of FIG. 2. The filter bank 418 preferably includes an amplifier 410 that boosts the combs received from the comb generator 216. The filter bank includes five band-pass filters 420, 422, 424, 426, and 428. The band-pass filters 420, 422, 424, 426, and 428 have center frequencies that correspond to different combs produced by the comb generator 216. The filter bank 218 selects a desired comb from the comb generator 216 by configuring single-pole, double-throw (SPDT) switches 412, 414, 416, and 418. The boosted combs are transmitted from the amplifier 410 to the band-pass filter having the center frequency that corresponds to the desired comb. For example, to select the 600 MHz comb, the SPDT switches 416 and 418 close in such a way as to connect the output of the amplifier 410 to the input of the band-pass filter 424. The selected band-pass filter passes the desired comb, and substantially blocks all other combs. On the output side of the band-pass filters, SPDT switches 432, 434, 436, and 438 connect the selected band-pass filter to an amplifier 440. The amplifier 440 boosts the selected comb, and passes the selected comb to the output of the filter bank 218.

Figure 5:
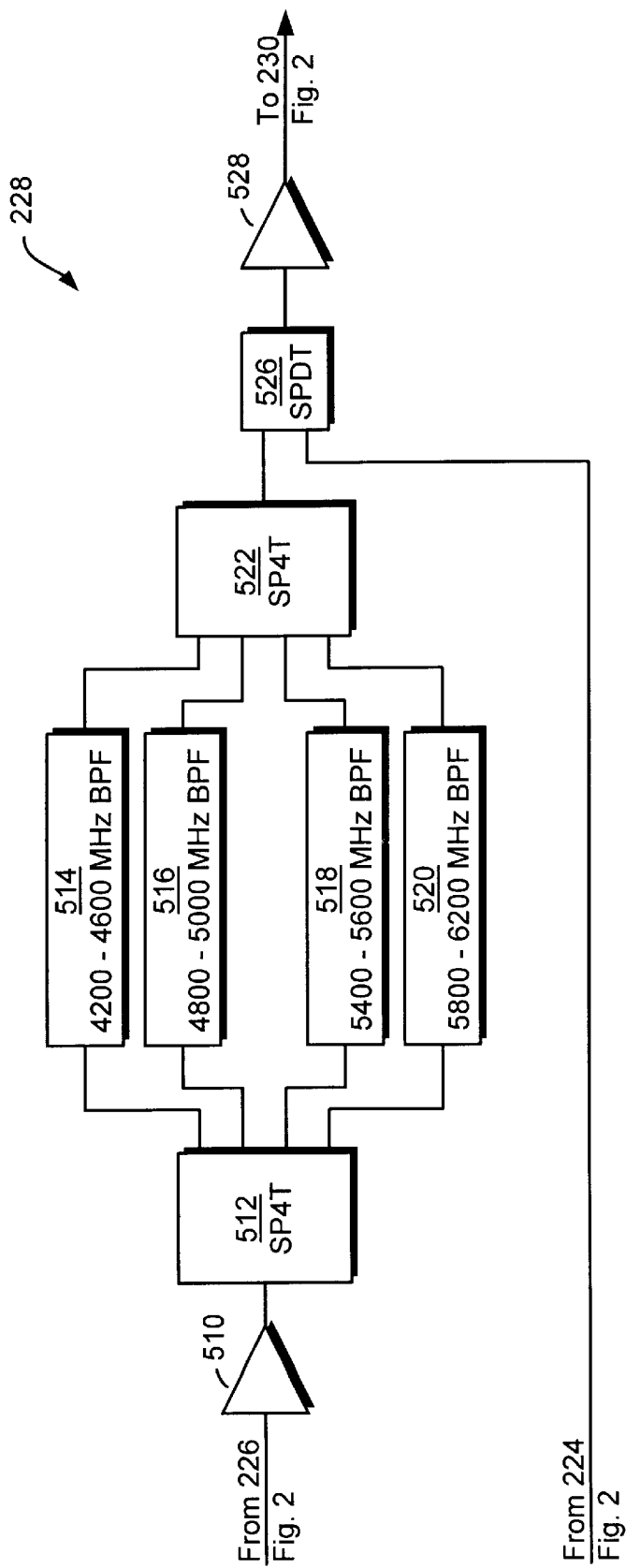
FIG. 5 is a simplified block diagram of a filter bank for selecting among the high-frequency combs in the synthesizer of FIG. 2.

FIG. 5 shows a detailed block diagram of the filter bank 228 of FIG. 2. In contrast with the filter bank 218, which selects from among low-frequency combs (i.e., 200 Mhz to 1 GHz in 200 MHz increments), the filter bank 228 selects from among mixing products of the selected low-frequency comb and the oscillator 222. These mixing products are spaced apart more widely in frequency than the spacing of the high-frequency combs. For example, when mixing the 1 GHz low-frequency comb with the 5.2 GHz oscillator, the closest mixing products are 2 GHz apart. By comparison, adjacent low frequency combs are only 200 MHz apart. Therefore, different band-pass filters need not be provided for each high-frequency comb, to accomplish the requisite filtering. To this end, the filter bank 228 includes four band-pass filters, 514, 516, 518, and 520. Band-pass filters are selected based on the desired high-frequency comb, according to table 2 below:

TABLE 2

| Desired HFC | Selected Band-Pass Filter |
| --- | --- |
| 4.4 GHz | 4.2 GHz–4.6 GHz (514) |
| 4.6 GHz | 4.2 GHz–4.6 GHz (514) |
| 4.8 GHz | 4.8 GHz–5.0 GHz (516) |
| 5.0 GHz | 4.8 GHz–5.0 GHz (516) |
| 5.2 GHz (Directly) | NONE |
| 5.4 GHz | 5.4 GHz–5.6 GHz (518) |
| 5.6 GHz | 5.4 GHz–5.6 GHz (518) |
| 5.8 GHz | 5.8 GHz–6.2 GHz (520) |
| 6.0 GHz | 5.8 GHz–6.2 GHz (520) |
| 6.2 GHz | 5.8 GHz–6.2 GHz (520) |

Advantages

By driving the wide-band input of a drift-cancel loop with a mixing product of the low-frequency combs and a stable oscillator, the resulting microwave synthesizer can produce exceedingly low phase noise. The synthesizer maintains low phase noise, even at high frequency offsets from the carrier, where drift-cancel loops are no longer useful at reducing phase noise.

Preliminary measurements of a prototype microwave synthesizer 200 show that overall phase noise is dominated not by the signal applied to the synthesizer's wide-band input, as in conventional designs, but by the signal at the narrow-band input. Driving the narrow-band input with a DDS having −155 dBc/Hz phase noise at 10 MHz offset, experiments have revealed an overall phase noise of only −153 dBc/Hz for the entire synthesizer. By comparison, designs that employ conventional voltage-controlled or YIG oscillators for driving the wide-band input produce approximately −140 to −143 dBc/Hz of phase noise, at least 10 dBc/Hz more phase noise than that of the instant design.

The microwave synthesizer according to the invention also has faster settling time than conventional synthesizers. YIG oscillators have response times on the order of tens of milliseconds. Voltage-controlled or YIG oscillators configured within phase-locked loops have stability requirements that tend to be satisfied at the expense of speed. By contrast, high-frequency combs can be switched in less than ten microseconds, three orders of magnitude faster than the settling time of YIG oscillators. The microwave synthesizer according to the invention is therefore able to change frequency at high speed. This enables the synthesizer to keep pace with devices that employ frequency hopping, such as those designed to the meet the Bluetooth specification. Bluetooth devices change their operating frequency at a maximum rate of once every 625 microseconds. The microwave synthesizer according to the invention can therefore test these devices as they are hopping in frequency, and it can do so with exceedingly low phase noise.

More generally, reduced test time for a device directly translates to reduced manufacturing cost. Another advantage of the invention is that, by reducing switching time, the synthesizer according to the invention allows customers to produce devices at lower cost.

Implementation

The microwave synthesizer 200 preferably takes the form of an instrument that plugs into a backplane of test system. The test system includes a host computer that communicates over the backplane and is capable of running test programs. The test programs include commands for controlling microwave synthesizer 200, for example, programming its frequency, programming its amplitude, performing calibration, and reading back status. The output of the synthesizer connects to a device under test directly, via suitable cabling and connectors, or through a high frequency switching matrix.

To operate in this environment, the microwave synthesizer 200 preferably includes a digital control circuit (not shown). The digital control circuit receives high level commands from a test program, and translates these commands into electronic signals for controlling the activities of the synthesizer 200. The digital control circuit also monitors activities within the synthesizer 200 and reports back to the test program.

The microwave synthesizer 200 preferably includes conventional output circuitry (not shown). This includes frequency multipliers for selectably providing different ranges of output frequencies under control of the digital control circuit. It also includes circuitry for adjusting the amplitudes of waveforms that the synthesizer 200 produces.

Alternatives

Having described one embodiment, numerous alternative embodiments or variations can be made. As described above, the oscillator 222 is a fixed-frequency dielectric resonance oscillator (DRO). Other types of oscillators can be used, however. For example, a variable-frequency oscillator can be used, provided that it is able to maintain low phase-noise over its operative frequency range. The preferred embodiment described above includes an oven-controlled crystal oscillator (OCXO) 214, for providing an exceedingly quiet frequency reference. Depending upon phase noise requirements, the OCXO 214 can be replaced with other types of oscillators.

Although the filter bank 218 is a preferred portion of the microwave synthesizer 200, it is not strictly required and could be omitted. Omission of the filter bank 218, however, places an additional burden on the filter bank 228 and on the band-pass filter 242 to rejected unwanted combs produced by the comb generator 216. Therefore, omitting the filter bank is expected to require more expensive components elsewhere in system, or to result in greater spurious signals.

As described above, the same comb generator 216 is used to produce both low frequency combs and high frequency combs. Alternatively, different comb generators could be used to produce the different sets of combs. For example, the output of a second comb generator could be mixed with the output of the oscillator to produce high-frequency combs.

Although the preferred embodiment is described above with reference to specific frequencies and ranges, nothing in the design of the microwave synthesizer 200 precludes other frequencies or frequency ranges from being used. For example, the combs need not be spaced by 200 MHz. Nor must the oscillator 222 operate at 5.2 GHz.

The embodiment of the synthesizer 200 described above takes the form of an instrument that plugs into a tester. The synthesizer 200 is not limited to this implementation, however. It could be provided as a bench-top instrument, for example, one that is stand-alone or programmable via an IEEE-488 bus. It could also be implemented as a modular instrument suitable for installing in a standard backplane, such as a VXI or PXI backplane.

Each of these alternatives and variations, as well as others, has been contemplated by the inventors and is intended to fall within the scope of the instant invention. It should be understood, therefore, that the foregoing description is by way of example, and the invention should be limited only by the spirit and scope of the appended claims.

What is claimed is:

1. A microwave synthesizer for providing stimulus for testing a device under test (DUT), comprising:

an narrow-band synthesizer providing an adjustable frequency output;

an oscillator providing a substantially fixed frequency output;

a comb generator providing a sequence of tones;

a first mixer having a first input, a second input, and an output, the first input coupled to the output of the comb generator and the second input coupled to the output of the oscillator;

a second mixer having a first input, a second input, and an output, the first input coupled to the output of the comb generator and the second input coupled to the output of the first mixer;

a third mixer having a first input, a second input, and an output, the first input coupled to the output of the second mixer and the second input coupled to the output of the narrow-band synthesizer; and a fourth mixer having a first input, a second input, and an output, a first input coupled to the output of the third mixer and a second input coupled to the output of the first mixer.

2. A microwave synthesizer as recited in claim 1, wherein the oscillator comprises a dielectric resonance oscillator (DRO).

3. A microwave synthesizer as recited in claim 1, further comprising a first power splitter having an input coupled to the output of the first mixer, a first output coupled to the second input of the second mixer, and a second output coupled to the second input of the fourth mixer.

4. A microwave synthesizer as recited in claim 3, further comprising a filter bank coupled in series between the output of the first mixer and the input of the first power splitter, the filter bank comprising a plurality of selectable band-pass filters for transmitting a desired mixing product of the first mixer and attenuating unwanted mixing products of the first mixer.

5. A microwave synthesizer as recited in claim 2, further comprising an oven-controlled crystal oscillator (OCXO) for generating a reference frequency, wherein the comb generator and the oscillator are constructed and arranged to establish their respective output frequencies in synchronization with the reference frequency.

6. A microwave synthesizer as recited in claim 5, wherein the narrow-band synthesizer and the OCXO are constructed and arranged to establish their respective output frequencies in synchronization with a tester clock reference.

7. A microwave synthesizer as recited in claim 3, further comprising a second power splitter having an input coupled to the output of the comb generator, a first output coupled to the second input of the first mixer, and a second output coupled to the second input of the second mixer.

8. A microwave synthesizer as recited in claim 3, further comprising:

a first band-pass filter coupled in series between the output of the second mixer and the first input of the third mixer;

a second band-pass filter coupled in series between the output of the third mixer and the first input of the fourth mixer; and a low-pass filter coupled to the output of the fourth mixer.

9. A microwave synthesizer as recited in claim 1, wherein the comb generator comprises a frequency multiplier, a crystal filter, and a comb generator coupled sequentially in series.

10. A microwave synthesizer, comprising:

a drift-cancel loop having a narrow-band input, a low-frequency comb input, a wide-band input, and an output generating an adjustable-frequency output signal;

an narrow-band synthesizer having an output coupled to the narrow-band input;

a comb generator, coupled to the low-frequency comb input and providing a sequence of tones;

an oscillator generating a substantially fixed frequency output; and a mixer having a first input coupled to the oscillator, a second input coupled to the comb generator, and an output coupled to the wide-band input of the drift-cancel loop.

11. A microwave synthesizer as recited in claim 10, further comprising an oven-controlled crystal oscillator (OCXO) coupled to the comb generator and the oscillator for synchronizing the comb generator and oscillator with the OCXO.

12. A microwave synthesizer as recited in claim 11, wherein the OCXO is coupled to a tester reference clock and oscillates in synchronization with the tester reference clock.

13. A microwave synthesizer as recited in claim 11, further comprising:

a filter bank coupled in series between the output of the mixer and the wide-band input of the drift-cancel loop, the filter bank comprising a plurality of selectable band-pass filters for transmitting a desired mixing product of the mixer and attenuating unwanted mixing products of the mixer.

14. A microwave synthesizer, comprising:

a drift-cancel loop having a narrow-band input, a frequency comb input, a wide-band input, and an output generating an adjustable frequency output signal;

an narrow-band synthesizer having an output coupled to the narrow-band input of the drift-cancel loop;

a comb generator, coupled to the frequency comb input of the drift-cancel loop and providing a sequence of tones;

an oscillator generating a substantially fixed frequency output; and means for combining the sequence of tones from the comb generator with the output frequency of the oscillator to generate an output signal that includes at least one of a sum and a difference of frequencies, the output signal being provided to the wide-band input of the drift-cancel loop.

15. A microwave synthesizer as recited in claim 14, further comprising an oven-controlled crystal oscillator (OCXO) coupled to the comb generator and the oscillator for synchronizing the comb generator and oscillator with the OCXO.

16. A microwave synthesizer as recited in claim 15, wherein the OCXO is coupled to a tester reference clock and oscillates in synchronization with the tester reference clock.

17. A method of generating a high frequency signal using a drift-cancel loop having a narrow-band input, a low-frequency comb input, a wide-band input, and an output generating an adjustable frequency output signal, the method including:

(A) applying an adjustable frequency signal to the narrow-band input of the drift-cancel loop;

(B) applying the sequence of tones combs separated by a substantially uniform tone spacing to the low-frequency comb input of the drift-cancel loop;

(C) combining the sequence of tones with a substantially fixed frequency signal to generate a combined signal that includes components corresponding to at least one of a sum and a difference of frequencies; and (D) applying the combined signal to the wide-band input of the drift-cancel loop.

18. A method as recited in claim 17, further comprising:

(E) selectively filtering the combined signal to substantially pass only a desired frequency component.

19. A method as recited in claim 18, further comprising varying the step E of selectively filtering to change the frequency component that is substantially passed.

20. A method as recited in claim 19, further comprising varying the adjustable frequency signal to establish a different output frequency.

* * * * *